(12) United States Patent
Pon et al.

(10) Patent No.: US 11,495,547 B2
(45) Date of Patent: Nov. 8, 2022

(54) FIBER REINFORCED STIFFENER

(71) Applicant: Intel Corporation, Santa Clara, CA (US)

(72) Inventors: Florence Pon, Folsom, CA (US); Tyler Leuten, Orangevale, CA (US); Maria Angela Damille Ramiso, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 878 days.

(21) Appl. No.: 16/160,222

(22) Filed: Oct. 15, 2018

(65) Prior Publication Data

US 2020/0118941 A1    Apr. 16, 2020

(51) Int. Cl.
| H01L 23/498 | (2006.01) |
| H01L 23/00 | (2006.01) |
| H01L 21/48 | (2006.01) |
| H01L 21/683 | (2006.01) |

(52) U.S. Cl.
CPC ........ H01L 23/562 (2013.01); H01L 21/4857 (2013.01); H01L 21/6835 (2013.01); H01L 23/49822 (2013.01); H01L 23/49838 (2013.01); *H01L 2221/68345* (2013.01)

(58) Field of Classification Search
CPC .............. H01L 23/562; H01L 21/4857; H01L 21/6835; H01L 23/49822; H01L 23/49838; H01L 2221/68345; H01L 2224/16227
USPC ........................................................ 257/668
See application file for complete search history.

(56) References Cited

U.S. PATENT DOCUMENTS 8,377,543 B2 *  2/2013  Ogatsu ................. H05K 1/0366
                                                          442/205
9,867,283 B2 *  1/2018  Kim ........................ H05K 1/03

* cited by examiner

*Primary Examiner* — Vu A Vu
(74) *Attorney, Agent, or Firm* — Schwabe Williamson & Wyatt PC

(57) ABSTRACT

Embodiments disclosed herein include electronic packages and methods of forming such packages. In an embodiment, the electronic package comprises a package substrate, where the package substrate comprises a plurality of buildup layers, and where each buildup layer has fiber reinforcement. In an embodiment, the electronic package further comprises a reinforcement layer, where the reinforcement layer comprises a buildup layer and fiber reinforcement, and where an orientation of the fibers in the reinforcement layer is different than an orientation of the fibers in the package substrate.

19 Claims, 10 Drawing Sheets

… (1)

FIBER REINFORCED STIFFENER

TECHNICAL FIELD

Embodiments of the present disclosure relate to electronic packaging, and more particularly, fiber reinforced stiffeners for electronic packaging.

BACKGROUND

As the form factor of electronic packaging is reduced, package warpage due to thin substrates is becoming an increasingly problematic issue. One solution for reducing warpage is to select polymer materials with lower coefficients of thermal expansion (CTE) to closer match the CTE of the silicon. However, as the ratio of silicon to mold compound in an electronic package continues to increase, it becomes difficult, if not impossible, to find molding compounds that have a sufficiently low CTE. For example the CTE of silicon may be 3-5 ppm/K compared to molding material CTE that is 7-10 ppm/K (at temperatures below the polymer's glass transition temperature) and 30-40 ppm/K (at temperatures above the glass transition temperature), even as the ceramic filler particle loading is increased. For exposed substrates which are not overmolded, metal frames have been soldered down to stiffen the perimeter of the package. The use of metal frames is not ideal, because the metal frame has a CTE mismatch with the substrate materials. As such, the metal frame may add to the warpage problem during temperature cycling.

EMBODIMENTS OF THE PRESENT DISCLOSURE

Described herein are electronic packages with fiber reinforcement stiffeners and methods of forming such electronic packages. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, CTE matching and metal frames do not provide the needed reduction in the warpage of electronic packages. Accordingly, embodiments disclosed herein include electronic packages with improved fiber orientation layouts to improve the stiffness of the electronic packages. Traditionally, fiber orientations of electronic package substrates are 0° and 90°. In embodiments disclosed herein, alternative fiber orientations other than 0° and 90° may be used to help balance the fiber weave across narrow, long span regions. For example, for a narrow long span region, 45° fiber orientations provide longer fibers than fibers that are 0° and 90° covering the same unit area.

In additional embodiments, the electronic packages may also comprise a reinforcement layer. The reinforcement layer may be a ring or a strip of buildup material that has fiber orientations other than 0° and 90°. The reinforcement layer may locally increase the stiffness of the electronic package. For example, a reinforcement layer ring may be used to minimize warpage of a large exposed area of the electronic package that is prone to warpage. Additionally, a reinforcement layer strip may be used to minimize warpage and increase the stiffness of a narrow span of the electronic package. Since the reinforcement layer comprises the same material as the electronic package, there is no coefficient of thermal expansion (CTE) mismatch.

Figure 1A:
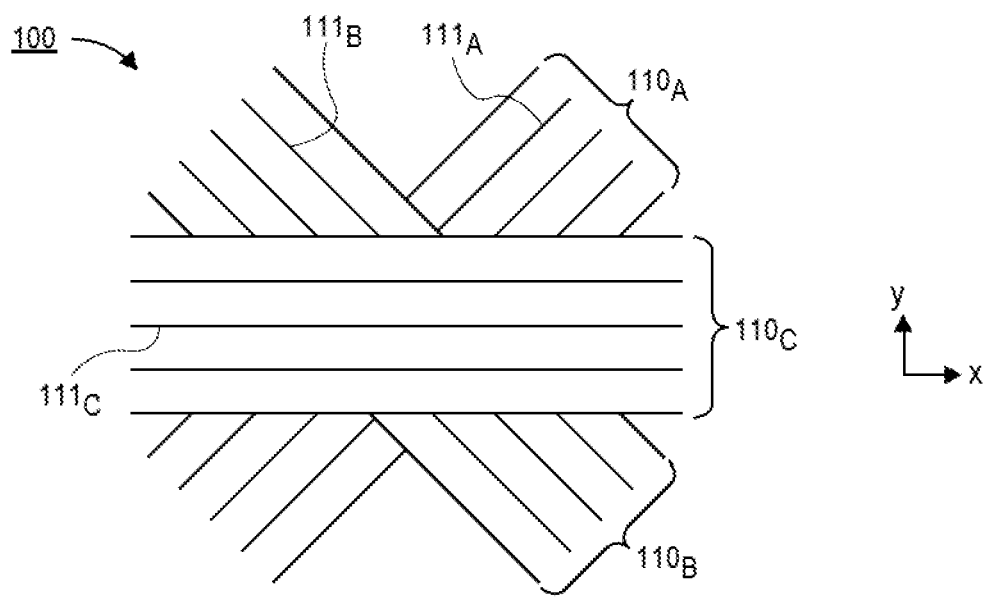
FIG. 1A is a plan view illustration of a stack of fiber reinforced layers with 45°, 135°, and 0° warp fiber orientations, in accordance with an embodiment.
Figure 1B:
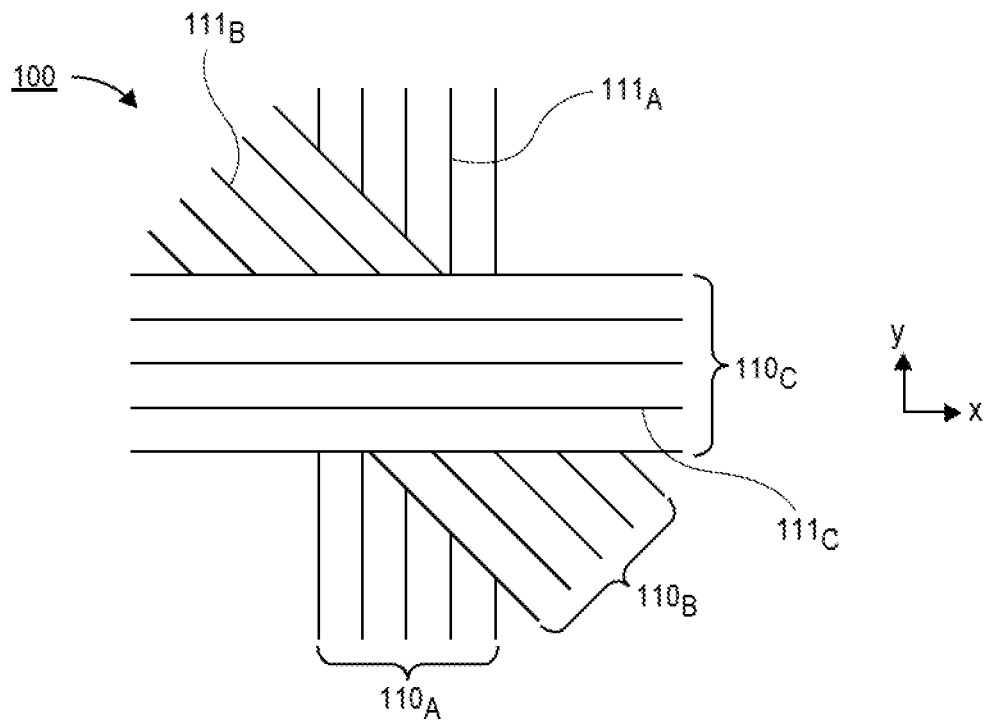
FIG. 1B is a plan view illustration of a stack of fiber reinforced layers with 90°, 135°, and 0° warp fiber orientations, in accordance with an embodiment.
Figure 1C:
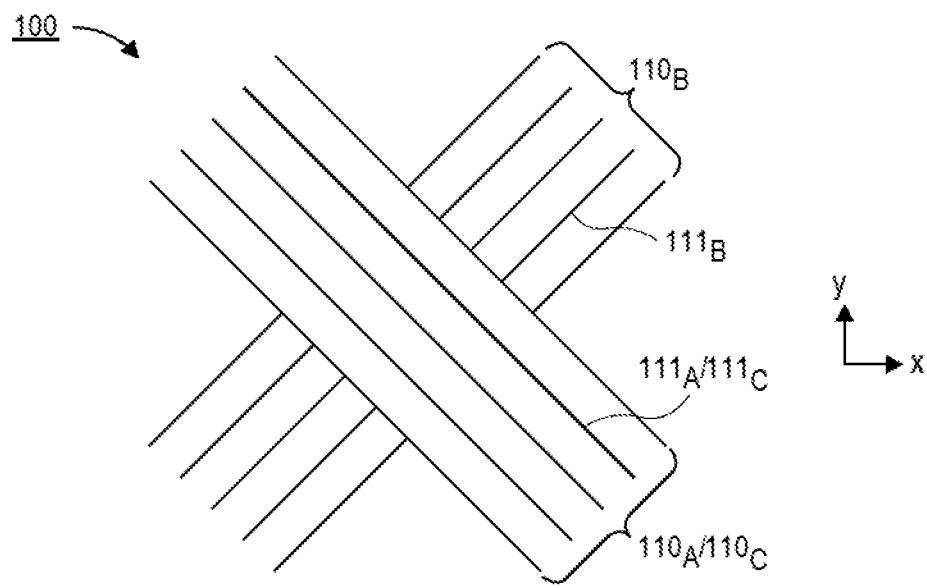
FIG. 1C is a plan view illustration of a stack of fiber reinforced layers with 135°, 45°, and 135° warp fiber orientations

Referring now to FIGS. 1A-1C, different layup patterns that may be used to form package substrates with improved stiffness or reinforcement layers that are added to select portions of a package substrate that needs reinforcement are shown, in accordance with various embodiments. In FIGS. 1A-1C, the warp fiber orientations are represented by the lines, and weft fiber orientations (i.e., fibers that are oriented 90° from the warp fibers, and which may (or may not) be interwoven with the warp fibers) are omitted in order to not obscure embodiments disclosed herein. In FIGS. 1A-1C each warp fiber orientation is shown as being a distinct layer. That is, each layer of a package substrate (i.e., each buildup layer) may have warp fibers that are oriented in a single direction. However, it is to be appreciated that a single package substrate layer may also comprise fibers with more than one warp orientation.

Referring now to FIG. 1A, a plan view illustration of a portion of a package substrate 100 is shown, in accordance with an embodiment. In an embodiment, package substrate 100 may comprise a first buildup layer $110_A$, a second buildup layer $110_B$, and a third buildup layer $110_C$. Each buildup layer $110_{A-C}$ may comprise a plurality of warp fibers 111. For example, the first buildup layer $110_A$ may comprise first warp fibers $111_A$ that are oriented in a first direction, the second buildup layer $110_B$ may comprise second warp fibers $111_B$ that are oriented in a second direction, and the third buildup layer $110_C$ may comprise third warp fibers $111_C$ that are oriented in a third direction. In the illustrated embodiment, only the warp fibers 111 are shown for clarity. However, it is to be appreciated that each buildup layer $110_{A-C}$ may comprise a dielectric material layer in which the warp fibers 111 and weft fibers (not shown) are embedded.

In an embodiment, the first direction, the second direction, and the third direction may all be different directions. For example, the first direction may be 45°, the second direction may be 135°, and the third direction may be 0°. In an embodiment, the first direction, the second direction, and the third direction may not all be orthogonal to each other. For example, the third direction (e.g., 0°) is not orthogonal to the first direction (e.g., 45°) and the second direction (e.g., 135°). The inclusion of non-orthogonal fiber orientations improves the stiffness of the package substrate 100 compared to traditional packages that only include orthogonal warp fiber orientation directions.

Referring now to FIG. 1B, a plan view illustration of a package substrate 100 is shown, in accordance with an additional embodiment. The package substrate 100 may be substantially similar to the package substrate 100 in FIG. 1A, with the exception that the warp fiber orientation directions are different. For example, the first warp fibers $111_A$ may be oriented at 90°, the second warp fibers $111_B$ may be oriented at 135°, and the third warp fibers $111_C$ may be oriented at 0°. Similar to the embodiment disclosed in FIG. 1A, the first direction, the second direction, and the third direction may not all be orthogonal to each other. For example, the second direction (e.g., 135°) is not orthogonal to the first direction (e.g., 90°) and the third direction (e.g., 0°).

Referring now to FIG. 1C, a plan view illustration of a package substrate 100 is shown, in accordance with an additional embodiment. The package substrate 100 may be substantially similar to the package substrate 100 described with respect to FIG. 1A, with the exception that the orientation of the warp fibers 111 are changed. In an embodiment, the first warp fibers $111_A$ and the third warp fibers $111_C$ may be oriented in the same direction. That is, the first direction and the third direction may be the same. In FIG. 1C, the first buildup layer $110_A$ and the third buildup layer $110_C$ are shown as being stacked on (i.e., only a single buildup layer is shown) since the orientation of the warp fibers are the same. In an embodiment, the first buildup layer $110_A$ may be separated from the third buildup layer $110_C$ by the second buildup layer $110_B$. In an embodiment, the first direction and the third direction may be orthogonal to the second direction. For example, the first direction and the third direction may be 135° and the second direction may be 45°. Even though the buildup layers have an orthogonal relationship, the package substrate 100 may still be referred to as off-angled. That is, the directions of the warp fibers may not be the standard 0° and 90° of traditional package substrates.

In FIGS. 1A-1C the warp fiber orientations are shown as being multiples of 45° (e.g., 0°, 45°, 90°, 135°). However, it is to be appreciated that the warp fiber orientations may be any desired angle. For example, the warp fiber orientations may be multiples of 60°, 30°, 15°, or the like. Furthermore, it is to be appreciated that the warp fiber orientations do not need to follow any pattern or be multiples of the same base angle. For example, first warp fibers $111_A$ may have a first orientation that is 15°, second warp fibers $111_A$ may have a second orientation that is 47°, and third warp fibers $111_C$ may have a third orientation that is 122°.

Figure 2A:
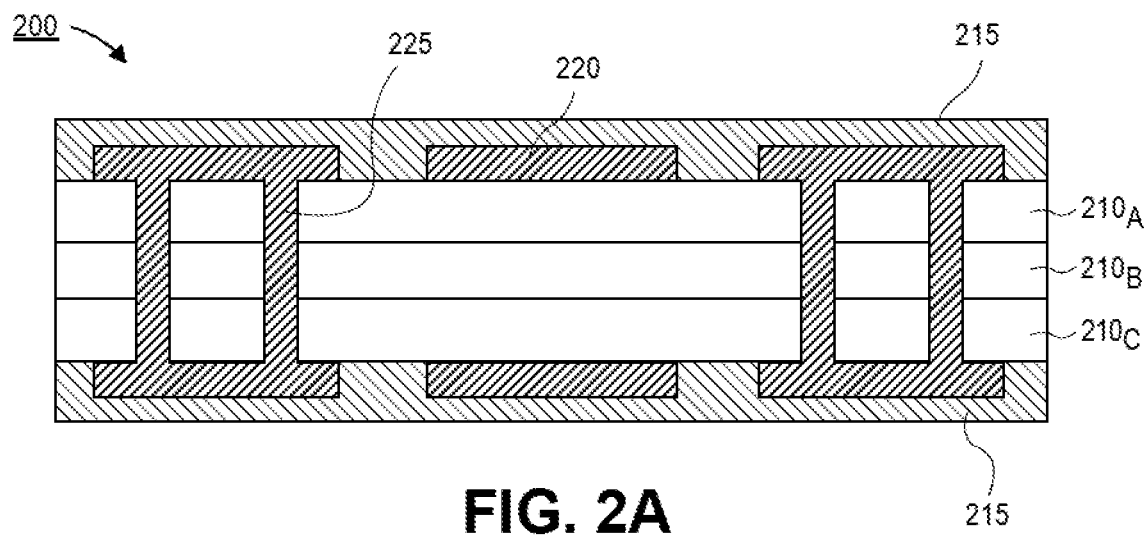
FIG. 2A is a cross-sectional illustration of an electronic package with a plurality of package layers with different fiber orientations, in accordance with an embodiment.

Referring now to FIG. 2A, a cross-sectional illustration of a package substrate 200 is shown, in accordance with an embodiment. In an embodiment, the package substrate 200 comprises a plurality of buildup layers 210. For example, the plurality of buildup layers 210 may include a first buildup layer $210_A$, a second buildup layer $210_B$, and a third buildup layer $210_C$. In an embodiment, solder resist layers 215 may be formed over surfaces of the first buildup layer $210_A$ and the third buildup layer $210_C$. Conductive features 220 and vias 225 may be formed in the package substrate 200.

In an embodiment, the plurality of buildup layers 210 may each comprise fibers embedded in a dielectric material. The fibers are not shown in FIG. 2A in order to not obscure the figures. In an embodiment, the fibers may be oriented in different directions. For example, warp fibers in the first buildup layer $210_A$ may be oriented in a first direction, warp fibers in the second buildup layer $210_E$ may be oriented in a second direction, and warp fibers in the third buildup layer $210_C$ may be oriented in a third direction. In some embodiments, the first direction, the second direction, and the third direction may not all be orthogonal to each other. In an embodiment, one or more of the first direction, the second direction, and the third direction may be off-angle. That is, one or more of the first direction, the second direction, and the third direction may be an angle other than 0° or 90°. In an embodiment, the warp fibers in the buildup layers $210_{A-C}$ may have a layup similar to one or more of the layups described above with respect to FIGS. 1A-1C.

In an embodiment, each buildup layer 210$_{A-C}$ may have warp fibers oriented in a single direction. In an additional embodiment, each buildup layer 210$_{A-C}$ may have one or more warp fiber orientations. For example, a single buildup layer 210 may comprise a first group of warp fibers that has a first orientation and a second group of warp fibers that has a second orientation. In such an embodiment, a greater number of warp fiber orientations may be provided in the package substrate 200, and the stiffness of the package substrate may be increased. Accordingly, warpage may be decreased.

Figure 2B:
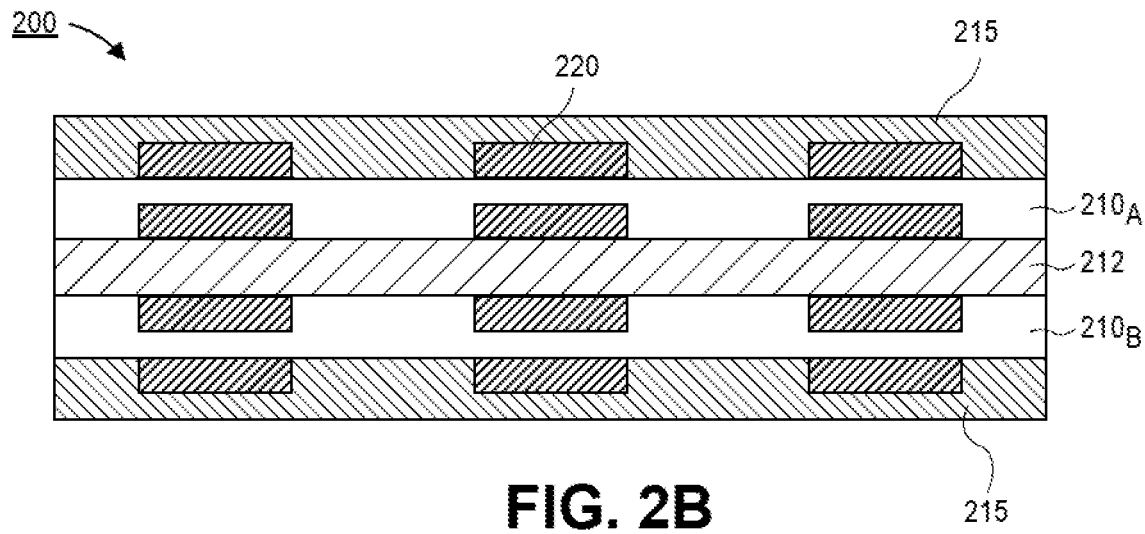
FIG. 2B is a cross-sectional illustration of an electronic package with package layers with different fiber orientations over a core layer, in accordance with an embodiment.

Referring now to FIG. 2B, a cross-sectional illustration of a package substrate 200 is shown, in accordance with an additional embodiment. The package substrate 200 may be substantially similar to the package substrate 200 described with respect to FIG. 2A, with the exception that the package may have a core 212. In an embodiment, the package substrate 200 may comprise a plurality of layers of conductive features 220. For example, four layers of conductive features 220 are shown in FIG. 2B. In an embodiment, the package substrate 200 may comprise solder resist layers 215. While not shown in FIG. 2B, it is to be appreciated that conductive vias may be formed through the buildup layers 210 and/or through the core 212.

In an embodiment, a first buildup layer 210$_A$ may be positioned over a surface of the core 212, and a second buildup layer 210$_B$ may be positioned over a second surface of the core 212. In an embodiment, the core may comprise warp fibers with an off-angle (i.e., an angle other than 90° or 0°) orientation. In the illustrated embodiment, the core 212 is shown as being substantially the same thickness as the buildup layers 210$_A$ and 210$_B$. However, it is to be appreciated that the core 212 may have any thickness, including a thickness that is greater than the thickness of the buildup layers 210$_A$ and 210$_B$.

In an embodiment, a first buildup layer 210$_A$ and a second buildup layer 210$_B$ is shown. However, it is to be appreciated that any number of buildup layers 210 may be formed over the surfaces of the core 212. In an embodiment, the buildup layers 210$_A$ and 210$_B$ may have warp fibers with an off-angle (i.e., an angle other than 90° or 0°) orientation. In an embodiment, the one or more buildup layers 210 and the core 212 may comprise warp fibers with orientations that are not all orthogonal to each other, similar to the layups shown in FIGS. 1A and 1B.

Figure 3A:
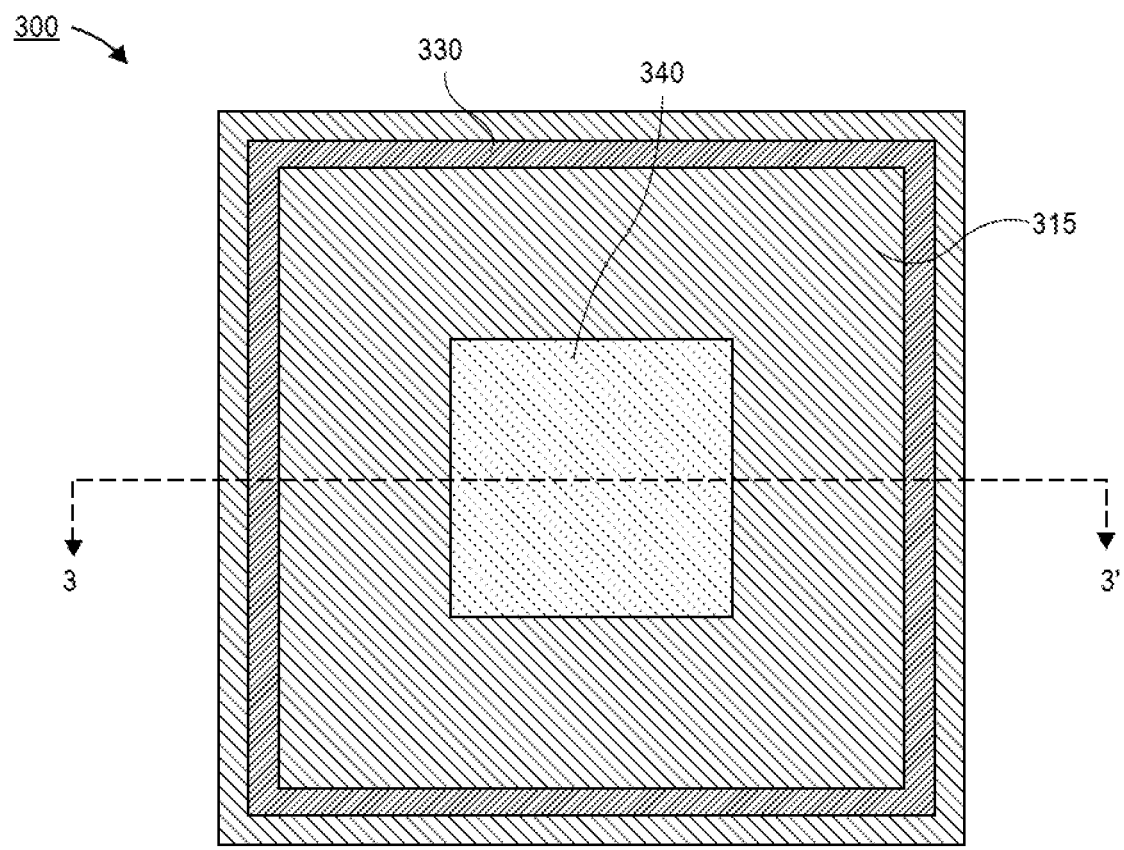
FIG. 3A is a plan view illustration of an electronic package with a reinforcement ring, in accordance with an embodiment.

Referring now to FIG. 3A, a plan view illustration of an electronic package 300 is shown, in accordance with an embodiment. In an embodiment, the electronic package 300 may comprise a package substrate with buildup layers (not visible in the plan view of FIG. 3A) with a solder resist layer 315 formed over the topmost buildup layer. Embodiments may also include a core (not shown). In some embodiments, the electronic package 300 may comprise warp fibers with 0° and 90° orientations. That is, the electronic package 300 may not have fiber reinforcement with off-angle warp fiber orientations in accordance with embodiments described above. In other embodiments, the electronic package 300 may have fiber reinforcement with off-angle warp fiber orientations, in accordance with embodiments described above.

In an embodiment, the electronic package 300 may comprise an overmolded component 340. For example, the overmolded component 340 may comprise a processor, a memory, a communication module, or the like. In embodiments without off-angle warp fiber orientations, the large area of the electronic package 300 surrounding the overmolded component 340 may be susceptible to warpage. Accordingly, embodiments may include a reinforcement layer 330. In an embodiment, the reinforcement layer 330 may comprise buildup material and warp fibers with off-angle fiber orientations. In an embodiment, the reinforcement layer 330 may comprise fibers with a single warp fiber orientation. Additional embodiments may include a reinforcement layer 330 that comprises fibers with more than one warp fiber orientation. For example, the reinforcement layer 330 may comprise a layup similar to the layups described above with respect to FIGS. 1A-1C. In the particular embodiment shown in FIG. 3A, the reinforcement layer 330 is a reinforcement ring that surrounds the overmolded component 340.

Providing such a reinforcement ring 330 enables localized reinforcement in locations where warpage would otherwise be expected. Furthermore, since the reinforcement layer 330 is formed of the same materials as the electronic package (e.g., buildup material and fibers) there is no CTE mismatch between the reinforcement layer 330 and the electronic package 300. Accordingly, temperature cycling will not result in additional stresses being applied to the electronic package 300 due to CTE mismatch.

Referring now to FIGS. 3B-3E, cross-sectional illustrations of the electronic package 300 along line 3-3' are shown, in accordance with various embodiments. In an embodiment, the electronic package 300 comprises a plurality of buildup layers 310. In the illustrated embodiment, the electronic package 300 may comprise a first buildup layer 310$_A$, a second buildup layer 310$_B$, and a third buildup layer 310$_C$. In an embodiment, the buildup layers 310$_{A-C}$ may each comprise a dielectric material and fibers. The warp fibers may have orientations that are 90° or 0° or any off-angle orientation, substantially similar to the layups described above with respect to FIGS. 1A-1C. Solder resist layers 315 may be formed over surfaces of the buildup layers 310.

In the illustrated embodiments, the overmolded component 340 is shown as a single block. However, it is to be appreciated that the overmolded component 340 may comprise one or more components that are embedded in a mold compound. In an embodiment, the overmolded component 340 may be electrically coupled to conductive traces and vias (not shown) that are embedded in the electronic package 300.

Figure 3B:
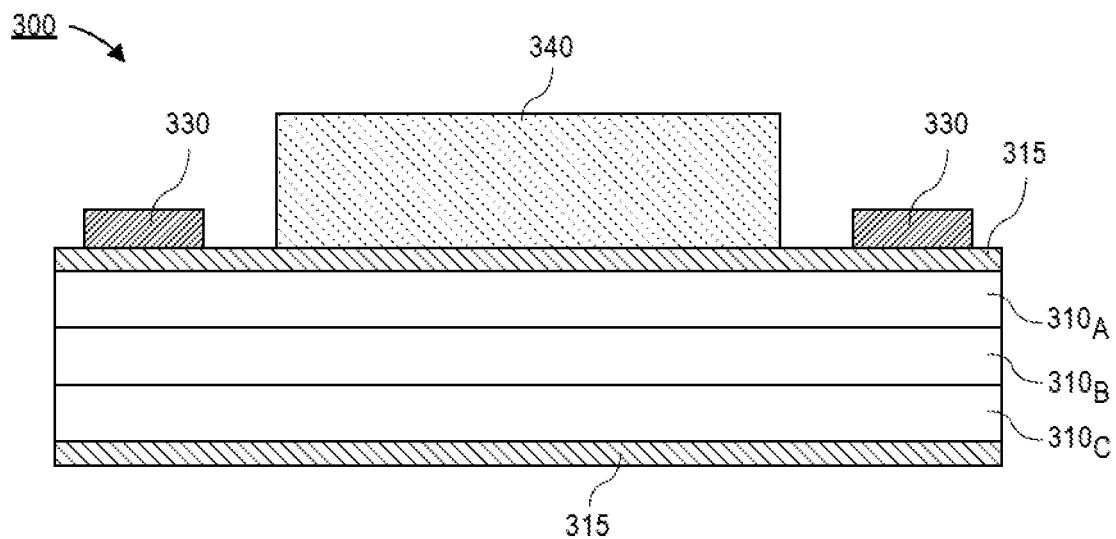
FIG. 3B is a cross-sectional illustration of the electronic package in FIG. 3A with the reinforcement ring on a top surface of the electronic package, in accordance with an embodiment.

Referring now specifically to FIG. 3B, the reinforcement layer 330 is shown as being attached to the top surface of the upper solder resist layer 315, in accordance with an embodiment. In an embodiment, the reinforcement layer 330 may be secured to the solder resist layer 315 with an adhesive or the like. In an embodiment, the reinforcement layer 315 may be positioned between the solder resist layer 315 and the first buildup layer 310$_A$.

Figure 3C:
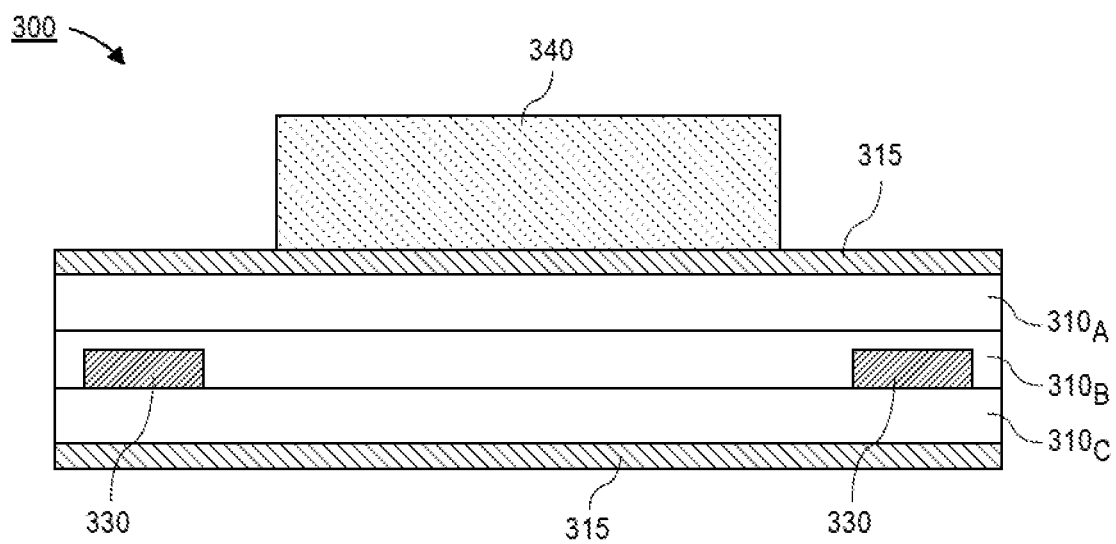
FIG. 3C is a cross-sectional illustration of the electronic package in FIG. 3A with the reinforcement ring embedded in the electronic package, in accordance with an embodiment.

Referring now to FIG. 3C, the reinforcement layer 330 is shown as being embedded in the electronic package 300, in accordance with an embodiment. In an embodiment, the reinforcement layer 330 may be adhered to one of the buildup layers (e.g., buildup layer 310$_C$) and subsequent buildup layers (e.g., buildup layer 310$_B$) are laminated over the reinforcement layer 330.

Figure 3D:
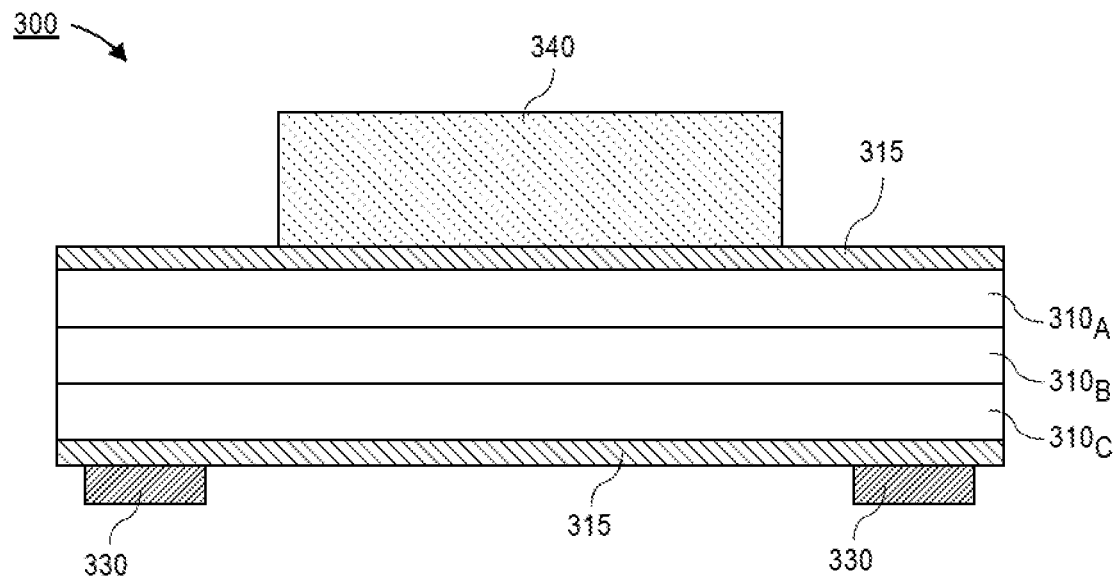
FIG. 3D is a cross-sectional illustration of the electronic package in FIG. 3A with the fiber reinforcement ring on a bottom surface of the electronic package, in accordance with an embodiment.

Referring now to FIG. 3D the reinforcement layer 330 is shown as being attached to the bottom surface of the lower solder resist layer 315, in accordance with an embodiment. In an embodiment, the reinforcement layer 330 may be secured to the solder resist layer 315 with an adhesive or the like. In an embodiment, the reinforcement layer 315 may be positioned between the solder resist layer 315 and the third buildup layer 310$_C$.

Figure 3E:
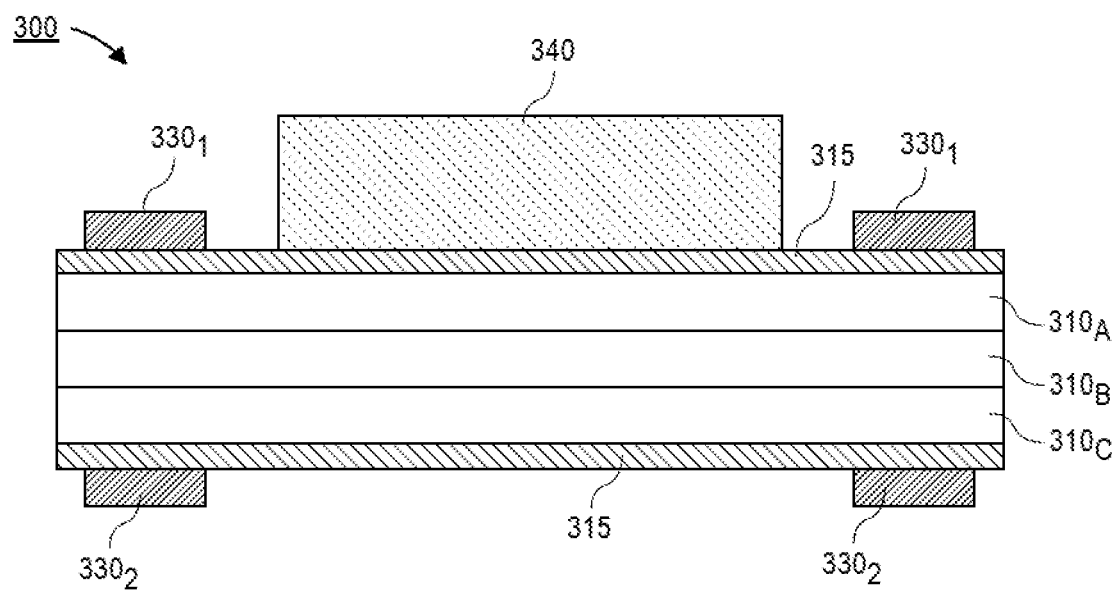
FIG. 3E is a cross-sectional illustration of the electronic package in FIG. 3A with a pair of fiber reinforcement rings on opposite surfaces of the electronic package, in accordance with an embodiment.

Referring now to FIG. 3E, a cross-sectional illustration of an electronic package 300 with a plurality of reinforcement layers 330 is shown, in accordance with an embodiment. For example, a first reinforcement layer 330₁ may be attached to a top surface of the upper solder resist layer 315 and a second reinforcement layer 330₂ may be attached to a bottom surface of the lower solder resist layer 315. In an embodiment, the reinforcement layers 330 may be formed in any layer of the electronic package 300. For example, a reinforcement layer 330 may be positioned between buildup layers 310. In an embodiment, more than two reinforcement layers 330 may also be included in the electronic package 300. Additionally, while the first reinforcement layer 330₁ is shown as being aligned with the second reinforcement layer 330₂, it is to be appreciated that the reinforcement layers 330 need not be aligned. In yet another embodiment, one or more concentric reinforcement rings 330 may be formed on the same surface of the electronic package 300.

Figure 4A:
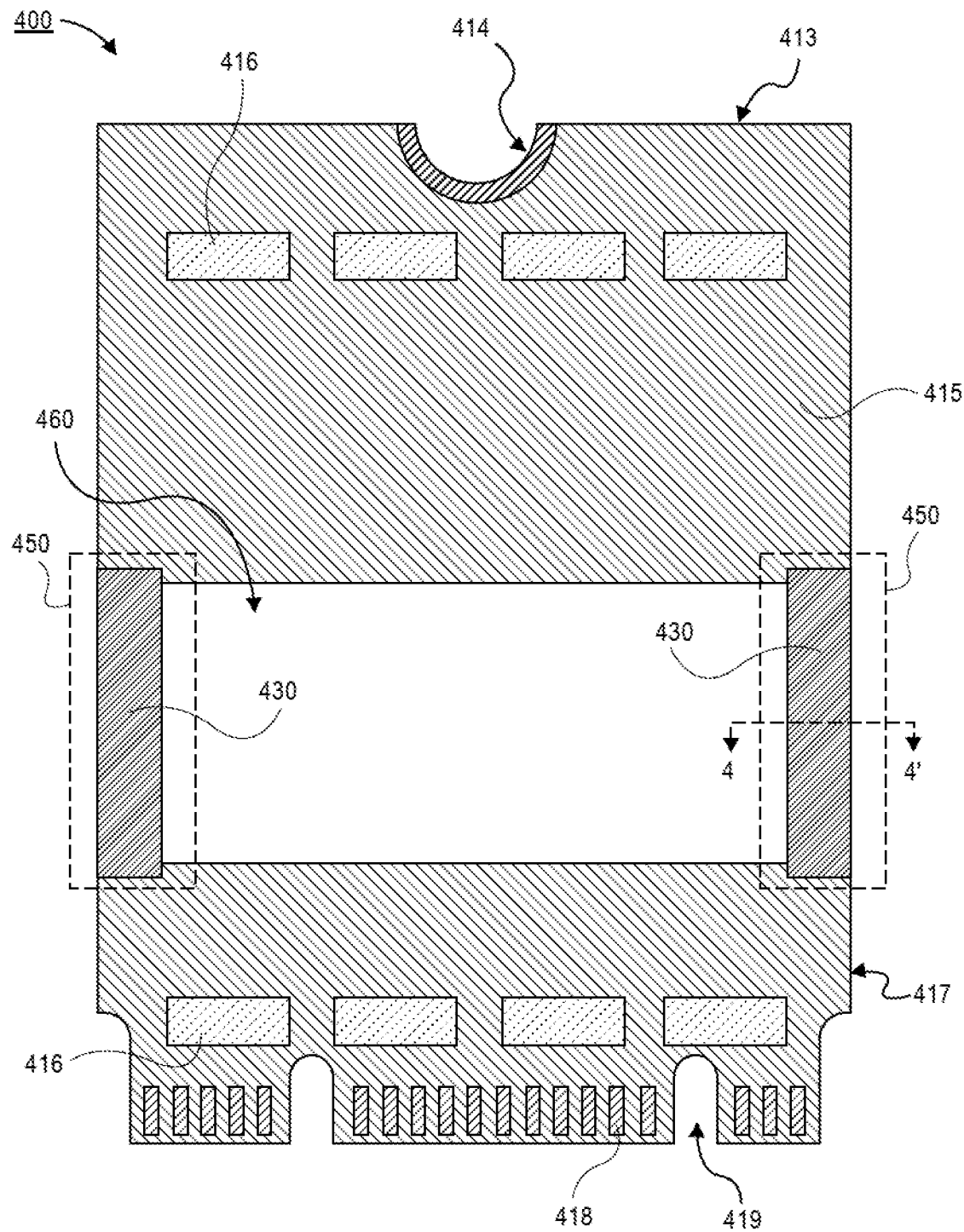
FIG. 4A is a plan view illustration of an electronic package with a pair of narrow spans that are reinforced with reinforcement strips, in accordance with an embodiment.

Referring now to FIG. 4A, a plan view illustration of an electronic package 400 is shown, in accordance with an additional embodiment. In an embodiment, the electronic package 400 may comprise end connectors suitable for connecting the electronic package 400 to a board (e.g., a motherboard). For example, the electronic package 400 may comprise a notch end 413 and a keyed end 417. The notch end 413 may comprise a notch 414 and components 416, and the keyed end 417 may comprise one or more key notches 419, pads 418, and components 416. The components 416 may comprise passive components or active components. In an embodiment, notch end 413 and the keyed end 417 of the electronic package may conform to standards, such as the M.2 standard or the like.

In an embodiment, the notch end 413 may be connected to the keyed end 417 by bridges 450. The bridges 450 may be narrow strips (e.g., a width of the bridge 450 may be less than a length of the bridge 450). The notch end 413, the keyed end 417, and the bridges 450 may define an opening 460 through the electronic package 400. Since the bridges 450 are narrow, they are inherently weaker than other portions of the electronic package 400. Accordingly, embodiments disclosed herein include an electronic package 400 that comprises fibers with off-angle orientations. In some embodiments, the electronic package 400 comprises buildup layers (i.e., below the solder resist layer 415) that comprise off-angle fiber orientations similar to the layups described with respect to FIGS. 1A-1C.

In some embodiments, the electronic package 400 may comprise warp fibers with 0° and 90° orientations. That is, the electronic package 400 may not have warp fiber reinforcement with off-angle fiber orientations in accordance with embodiments described above. In other embodiments, the electronic package 300 may have fiber reinforcement with off-angle warp fiber orientations, in accordance with embodiments described above. In some embodiments, the bridges 450 of the electronic package 400 may be susceptible to warpage, or other deformation due to their narrow cross-section. Accordingly, embodiments may include a reinforcement layer 430.

In an embodiment, the reinforcement layer 430 may comprise buildup material and warp fibers with off-angle fiber orientations. In an embodiment, the reinforcement layer 430 may comprise warp fibers with a single fiber orientation. Additional embodiments may include a reinforcement layer 430 that comprises warp fibers with more than one fiber orientation. For example, the reinforcement layer 430 may comprise a layup similar to the layups described above with respect to FIGS. 1A-1C. In the particular embodiment shown in FIG. 4A, the reinforcement layer 430 is a reinforcement strip that is positioned over at least a portion of the bridges 450.

Referring now to FIGS. 4B-4E, cross-sectional illustrations of a portion of the electronic package 400 along line 4-4' (i.e., along the bridge 450) are shown, in accordance with various embodiments. In an embodiment, the electronic package 400 comprises a plurality of buildup layers 410. In the illustrated embodiments, the electronic package 400 may comprise a first buildup layer 410$_A$, a second buildup layer 410$_B$, and a third buildup layer 410$_C$. In an embodiment, the buildup layers 410$_{A-C}$ may comprise a dielectric material and fibers. The warp fibers may have orientations that are 90° or 0° or any off-angle orientation, substantially similar to the layups described above with respect to FIGS. 1A-1C. Solder resist layers 415 may be formed over surfaces of the buildup layers 410.

Figure 4B:
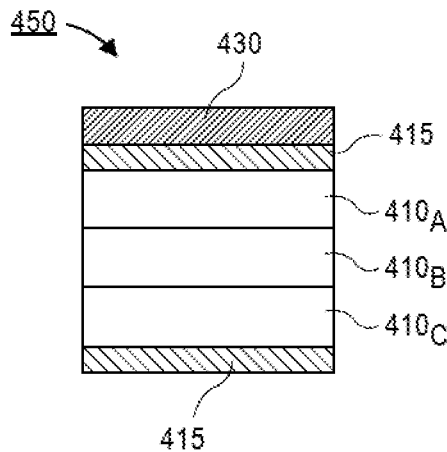
FIG. 4B is a cross-sectional illustration of a portion of the electronic package in FIG. 4A with the reinforcement strip on a top surface of the electronic package, in accordance with an embodiment.

Referring now specifically to FIG. 4B, the reinforcement layer 430 is shown as being attached to the top surface of the upper solder resist layer 415, in accordance with an embodiment. In an embodiment, the reinforcement layer 430 may be secured to the solder resist layer 415 with an adhesive or the like. In an embodiment, the reinforcement layer 415 may be positioned between the solder resist layer 415 and the first buildup layer 410$_A$.

Figure 4C:
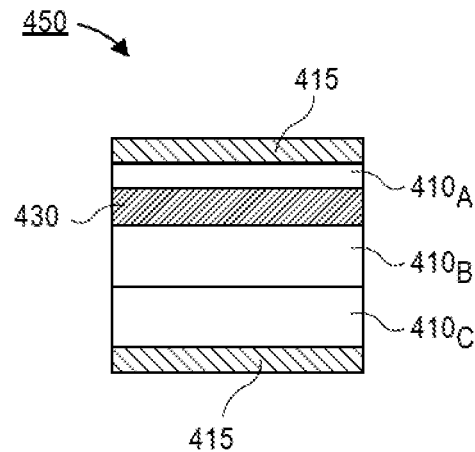
FIG. 4C is a cross-sectional illustration of a portion of the electronic package in FIG. 4A with the reinforcement strip embedded in the electronic package, in accordance with an embodiment.

Referring now to FIG. 4C, the reinforcement layer 430 is shown as being embedded in the electronic package 400, in accordance with an embodiment. In an embodiment, the reinforcement layer 430 may be adhered to one of the buildup layers (e.g., buildup layer 410$_C$) and subsequent buildup layers (e.g., buildup layer 410$_B$) are laminated over the reinforcement layer 430.

Figure 4D:
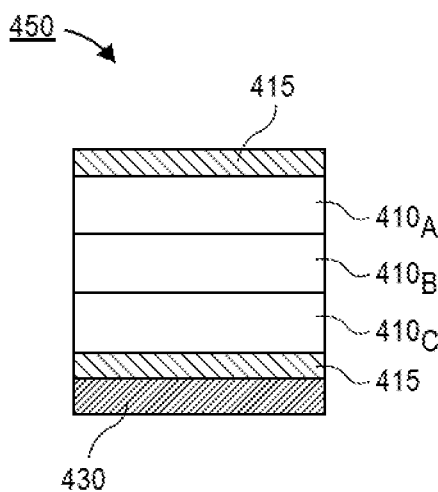
FIG. 4D is a cross-sectional illustration of a portion of the electronic package in FIG. 4A with the reinforcement strip on a bottom surface of the electronic package, in accordance with an embodiment.

Referring now to FIG. 4D the reinforcement layer 430 is shown as being attached to the bottom surface of the lower solder resist layer 415, in accordance with an embodiment. In an embodiment, the reinforcement layer 430 may be secured to the solder resist layer 415 with an adhesive or the like. In an embodiment, the reinforcement layer 415 may be positioned between the solder resist layer 415 and the third buildup layer 410$_C$.

Figure 4E:
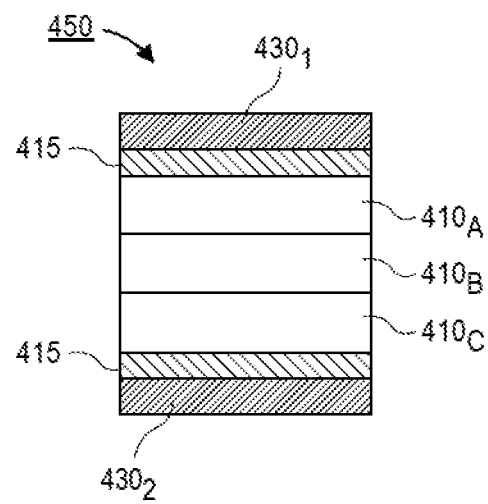
FIG. 4E is a cross-sectional illustration of a portion of the electronic package in FIG. 4A with a pair of reinforcement strips on opposing surfaces of the electronic package, in accordance with an embodiment.

Referring now to FIG. 4E, a cross-sectional illustration of an electronic package 400 with a plurality of reinforcement layers 430 is shown, in accordance with an embodiment. For example, a first reinforcement layer 430₁ may be attached to a top surface of the upper solder resist layer 415 and a second reinforcement layer 430₂ may be attached to a bottom surface of the lower solder resist layer 415. In an embodiment, the reinforcement layers 430 may be formed in any layer of the electronic package 400. For example, a reinforcement layer 430 may be positioned between buildup layers 410. In an embodiment, more than two reinforcement layers 430 may also be included in the electronic package 400.

Figure 5A:
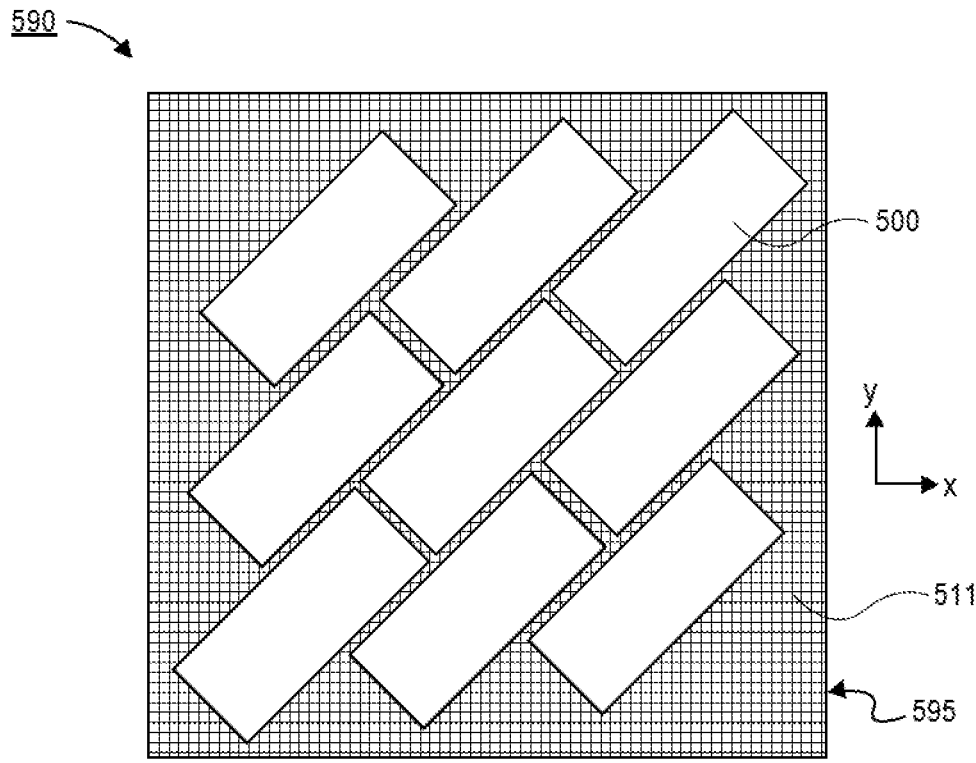
FIG. 5A is a plan view illustration of a plurality of electronic packages on a panel with fiber orientations at 0° and 90°, in accordance with an embodiment.
Figure 5B:
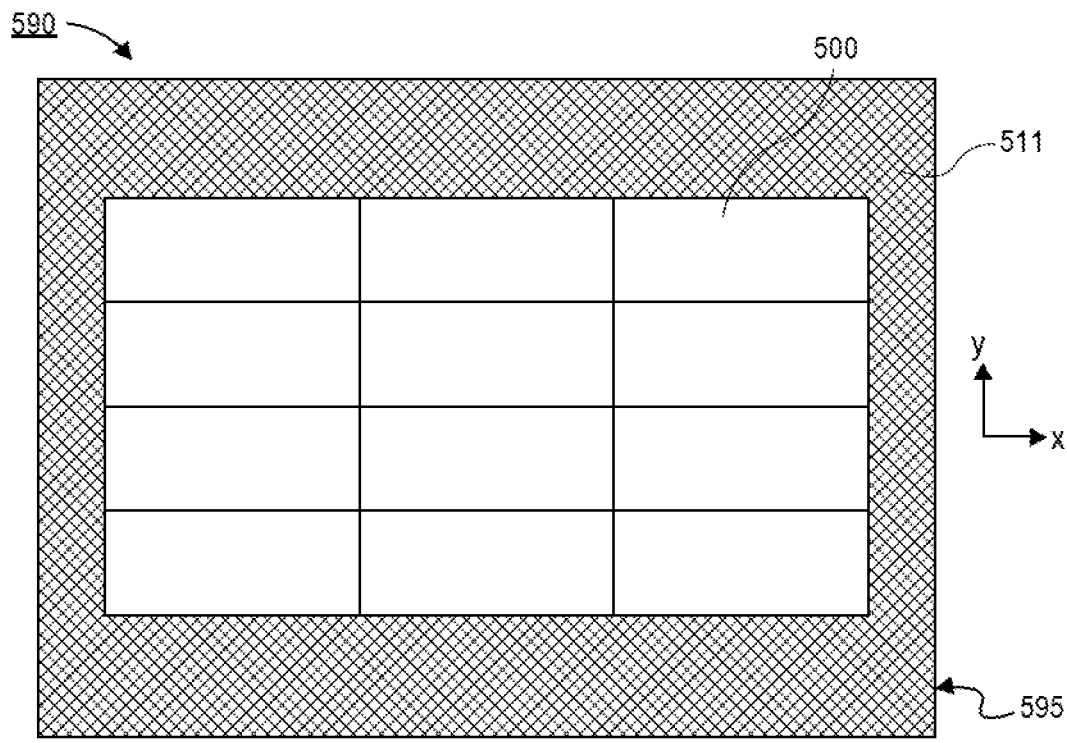
FIG. 5B is a plan view illustration of a plurality of electronic packages on a panel with fiber orientations at 45° and 135°, in accordance with an embodiment.

Referring now to FIGS. 5A and 5B, plan view illustrations of a panel 590 for forming electronic packages 500 are shown, in accordance with various embodiments. In FIG. 5A, the electronic packages 500 are oriented off-angle (in the X-Y plane). That is, the orientation of a longitudinal direction of the electronic packages 500 may be oriented at an off-angle. For example, the longitudinal direction of the electronic packages 500 may be oriented at an angle of 45° or any other desired angle. As such, a buildup layer with warp fibers 511 oriented at 0° or 90° (as shown in FIG. 5A) may result in an off-angle warp fibers 511 of substrate 595 for each of the electronic packages 500. In FIG. 5B, the electronic packages 500 are oriented without any angle (in the X-Y plane), and the buildup layer includes warp fibers 511 of substrate 595 that are oriented at an off-angle (e.g., 45° or 135°). That is, the longitudinal direction of the electronic packages 500 may be oriented at 0° or 90°. As such, the electronic packages 500 may be formed with warp fibers 511 that have an off-angle orientation.

Figure 6:
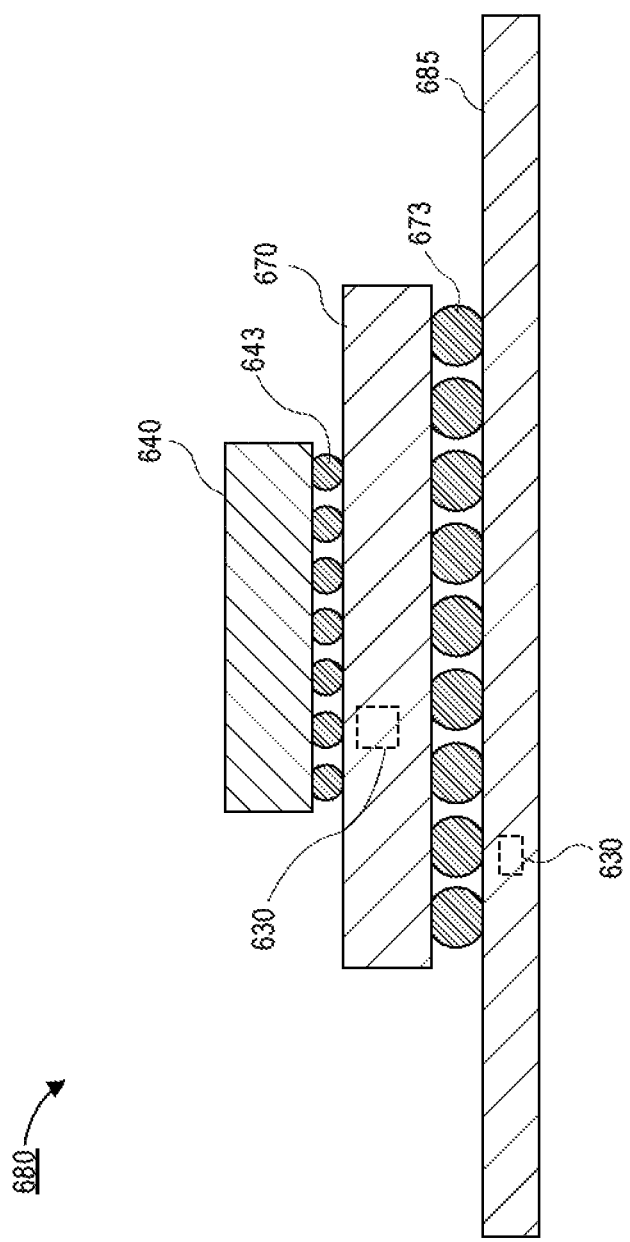
FIG. 6 is a cross-sectional illustration of an electronic package, in accordance with an embodiment.

Referring now to FIG. 6, a cross-sectional illustration of a packaged system 680 is shown, in accordance with an embodiment. In an embodiment, the packaged system 680 may include a die 640 electrically coupled to a package substrate 670 with solder bumps 643. In additional embodiments, the die 640 may be electrically coupled to the package substrate 670 with any suitable interconnect architecture, such as wire bonding, sockets, pins, or the like. The package substrate 670 may be electrically coupled to a board 685, such as a printed circuit board (PCB) with solder bumps 673 or any other suitable interconnect architecture, such as wire bonding, sockets, pins or the like.

In an embodiment, a reinforcement layer 630 with off-angled fibers similar to embodiments described above may be integrated into the package substrate 670 or the board 685, or the package substrate 670 and the board 685. Embodiments include any number of reinforcement layers 630 formed into the package substrate 670 and the board 685. The reinforcement layers 630 may comprise reinforcement rings, reinforcement strips or the like. In an embodiment, the package substrate 670 or the board 685, or the package substrate 670 and the board 685 may comprise buildup layers with fiber reinforcement that is off-angled. For example, the buildup layers may have fibers with layouts similar to fiber layouts described above.

Figure 7:
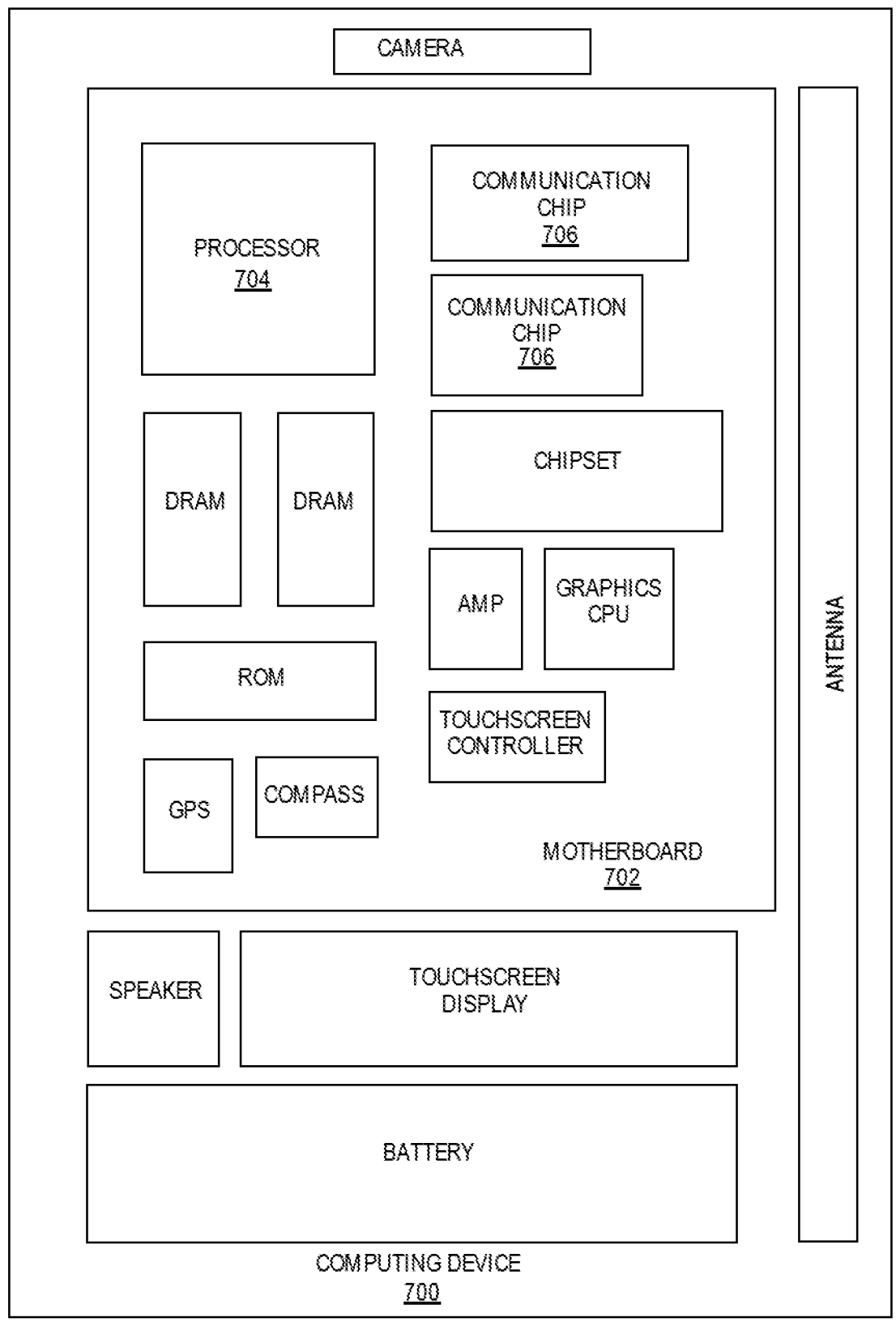
FIG. 7 is a schematic of a computing device built in accordance with an embodiment.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor may be packaged on a package substrate that comprises fibers with an off-angle orientation or on a package substrate that comprises a reinforcement layer with off-angle fiber orientations, in accordance with embodiments described herein. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip may be packaged on a package substrate that comprises fibers with an off-angle orientation or on a package substrate that comprises a reinforcement layer with off-angle fiber orientations, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1 an electronic package, comprising: a package substrate, wherein the package substrate comprises a plurality of buildup layers, wherein each buildup layer has fiber reinforcement; and a reinforcement layer, wherein the reinforcement layer comprises a buildup layer and fiber reinforcement, wherein an orientation of the fibers in the reinforcement layer is different than an orientation of the fibers in the package substrate.

Example 2 the electronic package of Example 1, wherein the reinforcement layer is a ring.

Example 3 the electronic package of Example 1 or Example 2, wherein the ring surrounds a molded component on the package substrate.

Example 4 the electronic package of Examples 1-3, wherein the ring is embedded in the package substrate.

Example 5 the electronic package of Examples 1-4, wherein the ring is on a top surface of the package substrate.

Example 6 the electronic package of Examples 1-5, wherein the ring is on a bottom surface of the package substrate.

Example 7 the electronic package of Examples 1-6, wherein the reinforcement layer is a strip.

Example 8 the electronic package of Examples 1-7, wherein the package substrate comprises a bridge spanning between a first portion of the package substrate and a second portion of the package substrate, and wherein the strip is formed on the bridge.

Example 9 the electronic package of Examples 1-8, wherein the orientation of the fibers in the package substrate is 90° and 0°.

Example 10 the electronic package of Examples 1-9, wherein the orientation of the fibers in the reinforcement layer is 45° or 135°.

Example 11 the electronic package of Examples 1-10, wherein the reinforcement layer is adhered to the package substrate with an adhesive.

Example 12 the electronic package, comprising: a first buildup layer, the first buildup layer having first fibers oriented in a first direction; a second buildup layer, the second buildup layer having second fibers oriented in a second direction; and a third buildup layer, the third buildup layer having third fibers oriented in a third direction, wherein the first direction, the second direction, and the third direction are not all orthogonal with respect to each other.

Example 13 the electronic package of Example 12, wherein the first direction is 45°, the second direction is 135°, and the third direction is 0°.

Example 14 the electronic package of Example 12 or Example 13, wherein the first direction is 90°, the second direction is 135°, and the third direction is 0°.

Example 15 the electronic package of Examples 12-14, wherein the first direction is the same as the third direction, and wherein the second buildup layer separates the first buildup layer from the third buildup layer.

Example 16 the electronic package of Examples 12-15, further comprising a reinforcement layer, wherein the reinforcement layer comprises the same materials as the buildup layers.

Example 17 the electronic package of Examples 12-16, wherein the reinforcement layer is a ring.

Example 18 the electronic package of Examples 12-17, wherein the reinforcement layer is a strip.

Example 19 the electronic package of Examples 12-18, wherein the electronic package comprises a bridge spanning between a first portion of the electronic package and a second portion of the electronic package, and wherein the strip is formed on the bridge.

Example 20 the electronic package of Examples 12-19, wherein the strip is formed over the third buildup layer.

Example 21 the electronic package of Examples 12-20, wherein the strip is embedded in the electronic package.

Example 22 the electronic package of Examples 12-21, further comprising a plurality of strips on the bridge.

Example 23 a method of forming an electronic package, comprising: laminating a first buildup layer on a carrier, wherein the first buildup layer comprises fibers with a first orientation; patterning a plurality of electronic packages on the first buildup layer, wherein the plurality of electronic packages are oriented so that an orientation of a longitudinal direction of the electronic packages is different than the first orientation.

Example 24 the method of Example 23, wherein the first orientation is 0° and the orientation of the longitudinal direction of the electronic packages is 45°.

Example 25 the method of Example: 23, wherein the first orientation is 45° and the orientation of the longitudinal direction of the electronic packages is 0°.

What is claimed is:

1. An electronic package, comprising:
a package substrate, wherein the package substrate comprises a plurality of buildup layers, wherein each buildup layer has fiber reinforcement; and
a reinforcement layer, wherein the reinforcement layer comprises a buildup layer and fiber reinforcement, wherein an orientation of the fibers in the reinforcement layer is different than an orientation of the fibers in the package substrate, wherein the reinforcement layer is a ring, and wherein the ring is embedded in the package substrate, or the ring is on a top surface of the package substrate, or the ring is on a bottom surface of the package substrate.

2. The electronic package of claim 1, wherein the ring surrounds a molded component on the package substrate.

3. The electronic package of claim 1, wherein the ring is embedded in the package substrate.

4. The electronic package of claim 1, wherein the ring is on the top surface of the package substrate.

5. The electronic package of claim 1, wherein the ring is on the bottom surface of the package substrate.

6. The electronic package of claim 1, wherein the orientation of the fibers in the package substrate is 90° and 0°.

7. The electronic package of claim 6, wherein the orientation of the fibers in the reinforcement layer is 45° or 135°.

8. The electronic package of claim 1, wherein the reinforcement layer is adhered to the package substrate with an adhesive.

9. An electronic package, comprising:
a package substrate, wherein the package substrate comprises a plurality of buildup layers, wherein each buildup layer has fiber reinforcement; and
a reinforcement layer, wherein the reinforcement layer comprises a buildup layer and fiber reinforcement, wherein an orientation of the fibers in the reinforcement layer is different than an orientation of the fibers in the package substrate, wherein the reinforcement layer is a strip, wherein the package substrate comprises a bridge spanning between a first portion of the package substrate and a second portion of the package substrate, and wherein the strip is formed on the bridge.

10. An electronic package, comprising:
a first buildup layer, the first buildup layer having first fibers oriented in a first direction;
a second buildup layer, the second buildup layer having second fibers oriented in a second direction;
a third buildup layer, the third buildup layer having third fibers oriented in a third direction, wherein the first direction, the second direction, and the third direction are not all orthogonal with respect to each other; and
a reinforcement layer, wherein the reinforcement layer comprises the same materials as the buildup layers, wherein the reinforcement layer is a strip, and wherein the electronic package comprises a bridge spanning between a first portion of the electronic package and a second portion of the electronic package, and wherein the strip is formed on the bridge.

11. The electronic package of claim 10, wherein the first direction is 45°, the second direction is 135°, and the third direction is 0°.

12. The electronic package of claim 10, wherein the first direction is 90°, the second direction is 135°, and the third direction is 0°.

13. The electronic package of claim 10, wherein the first direction is the same as the third direction, and wherein the second buildup layer separates the first buildup layer from the third buildup layer.

14. The electronic package of claim 10, wherein the strip is formed over the third buildup layer.

15. The electronic package of claim 10, wherein the strip is embedded in the electronic package.

16. The electronic package of claim 10, further comprising a plurality of strips on the bridge.

17. A method of forming an electronic package, comprising:
laminating a first buildup layer on a carrier, wherein the first buildup layer comprises fibers with a first orientation;
patterning a plurality of electronic packages on the first buildup layer, wherein the plurality of electronic packages are oriented so that an orientation of a longitudinal direction of the electronic packages is different than the first orientation, wherein the first orientation is 0° and the orientation of the longitudinal direction of the electronic packages is 45°, or wherein the first orientation is 45° and the orientation of the longitudinal direction of the electronic packages is 0°.

18. The method of claim 17, wherein the first orientation is 0° and the orientation of the longitudinal direction of the electronic packages is 45°.

19. The method of claim 17, wherein the first orientation is 45° and the orientation of the longitudinal direction of the electronic packages is 0°.

* * * * *